(12) United States Patent
Becker et al.

(10) Patent No.: US 11,742,868 B1
(45) Date of Patent: Aug. 29, 2023

(54) TIME TO DIGITAL CIRCUITRY WITH ERROR PROTECTION SCHEME

(71) Applicant: Micron Technology, Inc., Boise, ID (US)

(72) Inventors: Eric A. Becker, Boise, ID (US); Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 17/677,724

(22) Filed: Feb. 22, 2022

(51) Int. Cl.
  *H03M 1/06* (2006.01)
  *G04F 10/00* (2006.01)
  *H03M 7/16* (2006.01)
  *H03K 3/03* (2006.01)

(52) U.S. Cl.
  CPC ........ *H03M 1/0617* (2013.01); *G04F 10/005* (2013.01); *H03K 3/0315* (2013.01); *H03M 7/165* (2013.01)

(58) Field of Classification Search
  CPC ... H03M 1/0617; H03M 7/165; G04F 10/005; H03K 3/0315
  USPC .......................................................... 341/118
  See application file for complete search history.

(56) References Cited

U.S. PATENT DOCUMENTS

| | | | | |
|---|---|---|---|---|
| 8,022,849 B2 * | 9/2011 | Zhang | ................... | H03L 7/1976 341/142 |
| 8,023,235 B2 * | 9/2011 | Bilac | ....................... | H02H 3/33 361/42 |
| 8,669,794 B2 * | 3/2014 | Park | ..................... | G01R 19/255 327/147 |
| 9,240,776 B2 * | 1/2016 | Zimlich | .................... | H03K 7/08 |
| 10,903,974 B2 * | 1/2021 | Scarpa | ..................... | G01S 19/29 |
| 11,463,234 B2 * | 10/2022 | Scarpa | ..................... | G01S 19/29 |
| 2009/0198459 A1 * | 8/2009 | Bilac | ........................ | H02H 3/33 702/58 |
| 2009/0256601 A1 * | 10/2009 | Zhang | ...................... | H03L 7/085 341/111 |
| 2013/0194051 A1 * | 8/2013 | Zimlich | ................. | H03K 3/017 332/109 |
| 2013/0214831 A1 * | 8/2013 | Park | ...................... | G01R 19/255 327/156 |
| 2015/0077279 A1 * | 3/2015 | Song | ...................... | G04F 10/005 341/155 |
| 2016/0094235 A1 * | 3/2016 | Kuttner | ................. | H03M 1/662 341/144 |
| 2020/0052875 A1 * | 2/2020 | Scarpa | .................... | G01S 19/29 |

* cited by examiner

*Primary Examiner* — Jean B Jeanglaude
(74) *Attorney, Agent, or Firm* — Fletcher Yoder, P.C.

(57) ABSTRACT

A time to digital circuit may provide a time measurement of an event, or a time measurement of a duration between multiple events. Various electronic devices may include one or more time to digital circuits. A time to digital circuit may include circuitry to use Thermometer Code for measuring the duration of the time. For example, the time to digital circuit may generate alternating signals using a ring oscillator when receiving an indication of an event. Moreover, the time to digital circuit may convert the alternating signals to a consistent signal with only one transition between high and low signals in multiple consecutive signals. Furthermore, the time to digital circuit may correct erroneous signal values of the consistent signals when multiple transitions between high and low signals in multiple consecutive signals occurs.

20 Claims, 6 Drawing Sheets

TIME TO DIGITAL CIRCUITRY WITH ERROR PROTECTION SCHEME

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to electronic devices and more specifically to time to digital converting schemes used in different electronic devices. Such electronic devices may include memory devices, processing devices, routing circuitry, among other things. In some cases, a time to digital converter circuit may provide a digital representation of a time of an event using a clock signal. Alternatively or additionally, the time to digital converter circuit may provide a digital representation of a time difference between multiple events using the clock signal. For example, an electronic device may use the time to digital converter circuit to provide event signals, provide redundancy signals, convert a clock signal frequency, provide a time measurement of received data (e.g., sensor data), among other applications.

BRIEF DESCRIPTION OF THE DRAWINGS

Various aspects of this disclosure may be better understood upon reading the following detailed description and upon reference to the drawings in which.

DETAILED DESCRIPTION

Figure 1:
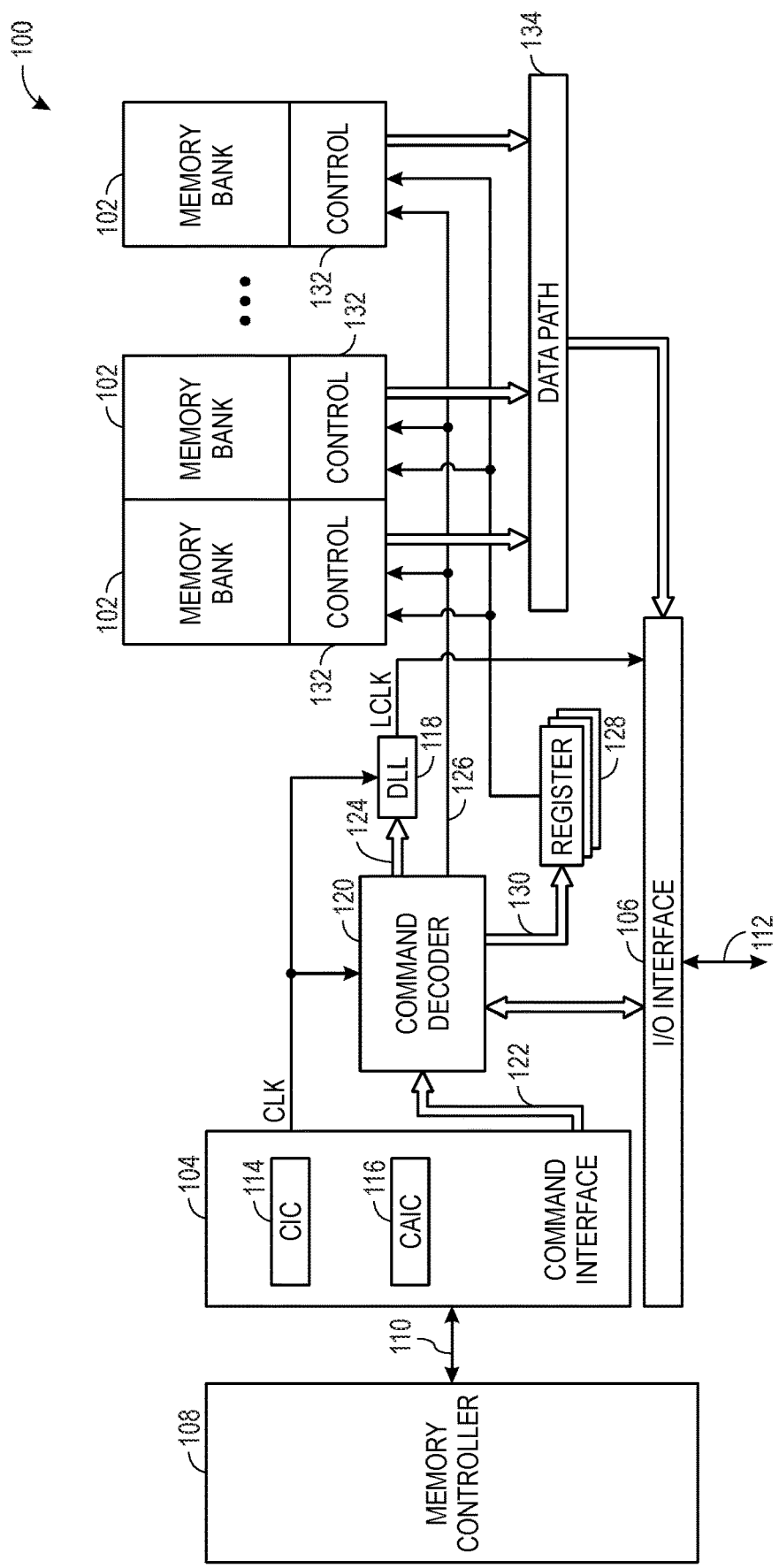
FIG. 1 is a block diagram illustrating certain features of a memory device, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An electronic device may include one or multiple time to digital circuits. The electronic device may use a time to digital circuit to measure a time of an event, a time difference between multiple events, among other time measurements. For example, the events may include internal or external events of the electronic device based on receiving one or more trigger signals. The time to digital circuit may include a ring oscillator, a converter, an encoder, and a counter.

The ring oscillator may provide an odd number of alternating signals using an odd number of inverting circuits (e.g., NAND logic gates, Inverter logic gates, etc.) coupled in series. For example, each of the alternating signals may switch between a high value (e.g., logic 1, high) and a low value (e.g., a logic 0, low). Moreover, the ring oscillator may provide the odd number of alternating signals in parallel to the converter.

An example of the alternating signals is produced below in Table 1. For example, the ring oscillator may provide the alternating signals to the converter based on using an alternating code shown in Table 1.

TABLE 1

| Alternating Code | Integer Value |
| --- | --- |
| 0b100001010 | 5 |
| 0b100101010 | 6 |
| 0b000101010 | 7 |
| 0b010101010 | 8 |
| 0b010101000 | 9 |
| 0b010101001 | 10 |
| 0b010100001 | 11 |
| 0b010100101 | 12 |
| 0b010000101 | 13 |
| 0b010010101 | 14 |
| 0b000010101 | 15 |
| 0b001010101 | 16 |
| 0b001010100 | 17 |
| 0b101010100 | 0 |
| 0b101010000 | 1 |
| 0b101010010 | 2 |
| 0b101000010 | 3 |
| 0b101001010 | 4 |
| 0b100001010 | 5 |

Moreover, the ring oscillator may receive a trigger signal associated with an event. In some cases, the trigger signal may stay high (e.g., logic 1) for a duration of time associated with the event. For example, a first event may set the trigger signal to high (e.g., high value, logic 1) and a subsequent second event may set the trigger signal to low (e.g., low value, logic 0). In some cases, the ring oscillator may receive a first trigger signal (e.g., start trigger signal) indicative of a start of an event and receive a second trigger signal (e.g., stop trigger signal) subsequent to receiving the first trigger signal indicative of an end of the event. The ring oscillator may facilitate determining a digital time representation of the duration of the event based on the trigger signal.

In some cases, the ring oscillator may provide the alternating signals with a changed pattern in response to receiving the high trigger signal. For example, the ring oscillator may provide the alternating signals with a first pattern when the trigger signal is low and may provide the alternating signals with a second pattern when the trigger signal is high. However, when using the alternating signals, determining a first transition between the first pattern and the second pattern, or determining a second transition between the second pattern and the first pattern, may be difficult.

In some cases, determining the trigger signal based on the first transition and/or the second transition using the alternating signals may make the time to digital circuit prone to various circuit failures. Such circuit errors may result in incorrect time measurements by the time to digital circuit. For example, a violation of setup time of a rising edge and/or a falling edge of one of the alternating signals, resulting in a metastable condition in any of the latching circuits or the encoder, among other things, may cause such incorrect time measurements when using the alternating signals.

Accordingly, the time to digital circuit may use the converter to provide consistent signals to the encoder based on receiving the alternating signals from the ring oscillator. The consistent signals may include consistently high or low value consecutive signals with one (e.g., only one) transition between the high and low values across multiple (e.g., a word length of) consecutive signals. For example, the converter may provide the consistent signals using a Thermometer code. In some cases, providing the consistent signals using the Thermometer Code may increase a resolution of the time measurement. An example of the consistent signals using the Thermometer Code is shown in Table 2.

TABLE 2

| Thermometer Code | Integer Value |
| --- | --- |
| 0b111000000 | 5 |
| 0b110000000 | 6 |
| 0b100000000 | 7 |
| 0b000000000 | 8 |
| 0b000000001 | 9 |
| 0b000000011 | 10 |
| 0b000000111 | 11 |
| 0b000001111 | 12 |
| 0b000011111 | 13 |
| 0b000111111 | 14 |
| 0b001111111 | 15 |
| 0b011111111 | 16 |
| 0b111111111 | 17 |
| 0b111111110 | 0 |
| 0b111111100 | 1 |
| 0b111111000 | 2 |
| 0b111110000 | 3 |
| 0b111100000 | 4 |
| 0b111000000 | 5 |

As shown in the Table 2, the Thermometer Code may include only one transition between high and low signals after a number of high and/or low signals. In one example, the converter may provide consistent high signals (e.g., only high signals) when receiving the alternating signals with the first pattern. As mentioned above, the ring oscillator may provide the alternating signals with the first pattern when the trigger signal is low.

Moreover, based on the first transition between the first pattern and the second pattern of alternating signals, the converter may transition to providing consistent low signals using the Thermometer Code. For example, the converter may provide an odd number of consecutive low signals when receiving the odd number of alternating signals with the second pattern from the odd number of inverting circuits. As mentioned above, the ring oscillator may provide the alternating signals with the second pattern when the trigger signal is high.

Subsequently, when continuously receiving the alternating signals with the second pattern, the converter may transition between providing the odd number of consistent low signals and an odd number of consistent high signals using the Thermometer Code. Accordingly, the converter may switch between providing the high and/or low consistent signals with one transition between the high and/or the low consistent signals after providing every odd number of high and/or low consistent signals. The converter may provide consistent high signals (e.g., only high signals) in response to the second transition between the second pattern and the first pattern of alternating signals.

In any case, the converter may provide the consistent signals using the Thermometer Code to the encoder when receiving the alternating code. As mentioned above, the Thermometer Code may include only one transition between a number of consecutive high or low signals. Accordingly, the encoder may correct erroneous signals based on comparing consecutive signals of the consistent signals provided using the Thermometer Code. For example, the encoder may correct the erroneous signals when consecutive consistent signals, provided by using the Thermometer Code, include multiple consecutive transitions between high and low values.

In some cases, the encoder may correct the determined erroneous signals by flipping a value of the inconsistent signal (e.g., the erroneous signal). Subsequently, the encoder may provide the corrected signals to the counter for measuring the time. The counter may provide a digital time representation of a duration of receiving the consistent signals transitioning between the odd number of consistent low signals and the odd number of consistent high signals. Accordingly, the time to digital circuit may measure a time of an event, a time difference between multiple events, among other time measurements, based on a duration of the trigger signal.

The time to digital circuit may use the consistent signals (e.g., the Thermometer Code) to provide correct time measurement based on detecting and correcting erroneous signals. For example, the encoder may correct erroneous signals caused by metastable conditions when providing the consistent signals to the counter. As such, the time to digital circuit may become more reliable. In some cases, using such time to digital circuits may reduce a test time and/or a number of operations for a time measurement based on the improved reliability.

Turning now to the figures, FIG. 1 depicts a simplified block diagram illustrating certain features of a memory device 100 (e.g., a memory subsystem of an apparatus). Specifically, the block diagram of FIG. 1 depicts a functional block diagram illustrating certain functionality of the memory device 100. In accordance with one embodiment, the memory device 100 may include a random access memory (RAM) device, a ferroelectric RAM (FeRAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such 3D memory array may include a corresponding logic storing device (e.g., a capacitor, a resistor, or the resistance of the chalcogenide material(s)).

The memory device 100 may include a number of memory banks 102 each inclusive of one or more memory arrays. Various configurations, organizations, and sizes of the memory banks 102 on the memory device 100 may be used based on an application and/or design of the memory device 100 within an electrical system. For example, in different embodiments, the memory banks 102 may include a different number of rows and/or columns of memory cells. Moreover, the memory banks 102 may each include a number of pins for communicating with other blocks of the memory device 100. For example, each memory bank 102 may receive one data bit per pin at each clock cycle.

The memory device 100 may also include a command interface 104 and an input/output (I/O) interface 106. The command interface 104 is configured to provide a number of signals received from a processor (e.g., a processor subsystem of an apparatus) or a controller, such as a memory controller 108. In different embodiments, the memory controller 108, hereinafter controller 108, may include one or more processors (e.g., memory processors), one or more programmable logic fabrics, or any other suitable processing components.

In some embodiments, a bus 110 may provide a signal path or a group of signal paths to allow bidirectional communication between the controller 108, the command interface 104 and the I/O interface 106. For example, the controller 108 may receive memory access requests from the I/O interface via the command interface 104 and the bus 110. Moreover, the controller 108 may provide the access commands and/or access instructions for performing memory operations to the command interface 104 via the bus 110.

Similarly, an external bus 112 may provide another signal path or group of signal paths to allow for bidirectional transmission of signals, such as data signals and access commands (e.g., read/write requests), between the I/O interface 106, the controller 108, a command decoder 120, and/or other components. Thus, the controller 108 may provide various signals (e.g., the access commands, the access instructions, or other signals) to different components of the memory device 100 to facilitate the transmission and receipt of data to be written to or read from the memory banks 102.

That said, the command interface 104 may receive different signals from the controller 108. For example, a reset command may be used to reset the command interface 104, status registers, state machines and the like, during power-up. Various testing signals may also be provided to the memory device 100. For example, the controller 108 may use such testing signals to test connectivity of different components of the memory device 100. In some embodiments, the command interface 104 may also provide an alert signal to the controller 108 upon detection of an error in the memory device 100. Moreover, the I/O interface 106 may additionally or alternatively be used for providing such alert signals, for example, to other system components electrically connected to the memory device 100.

The command interface 104 may also receive one or more clock signals from an external device (e.g., an external clock signal). Moreover, the command interface 104 may include a clock input circuit 114 (CIC) and a command address input circuit 116 (CAIC). The command interface 104 may use the clock input circuit 114 and the command address input circuit 116 to receive the input signals, including the access commands, to facilitate communication with the memory banks 102 and other components of the memory device 100.

Moreover, the clock input circuit 114 may receive the one or more clock signals (e.g., the external clock signal) and may generate an internal clock signal (CLK) therefrom. In some embodiments, the command interface 104 may provide the CLK to the command decoder 120 and an internal clock generator, such as a delay locked loop (DLL) 118 circuit. The DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the external bus 112.

The command interface 104 may also provide the internal clock signal CLK to various other memory components. As mentioned above, the command decoder 120 may receive the internal clock signal CLK. In some cases, the command decoder 120 may also receive the access commands via a bus 122 and/or through the I/O interface 106 received via the external bus 112. For example, the command decoder 120 may receive the access commands through the I/O interface 106 transmitted by one or more external devices. In some cases, a processor may transmit the access commands.

The command decoder 120 may decode the access commands and/or the memory access requests to provide corresponding access instructions for accessing target memory cells. For instance, the command decoder 120 may provide the access instructions to one or more control blocks 132 associated with the memory banks 102 via a bus path 126. In some cases, the command decoder 120 may provide the access instructions to the control blocks 132 in coordination with the DLL 118 over a bus 124. For example, the command decoder 120 may coordinate generation of the access instructions in-line (e.g., synchronized) with the CLK and/or LCLK.

In some embodiments, each memory bank 102 may include a respective control block 132. In some cases, each of the control blocks 132 may also provide row decoding and column decoding capability based on receiving the access instructions. Accordingly, the control block 132 may facilitate accessing the memory cells of the respective memory banks 102. For example, the control blocks 132 may include circuitry (e.g., logic circuitry) to facilitate accessing the memory cells of the respective memory banks 102 based on receiving the access instructions.

In some cases, the control blocks 132 may receive the access instructions and determine target memory banks 102 associated with the target memory cells. In specific cases, the command decoder 120 may include the control blocks 132. Moreover, the control blocks 132 may also provide timing control and data control functions to facilitate execution of different commands with respect to the respective memory banks 102.

Furthermore, the command decoder 120 may provide register commands to the one or more registers 128 to facilitate operations of one or more of the memory banks 102, the control blocks 132, and the like. For example, one of the one or more registers 128 may provide instructions to configure various modes of programmable operations and/or configurations of the memory device 100. The one or more registers 128 may be included in various semiconductor devices to provide and/or define operations of various components of the memory device 100.

In some embodiments, the one or more registers 128 may provide configuration information to define operations of the memory device 100. For example, the one or more registers 128 may include operation instructions for DRAMs, synchronous DRAMs, FeRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command path, and a common read command path. The one or more global wiring lines 130 may traverse across the memory device 100, such that each of the one or more registers 128 may couple to the global wiring lines 130. The additional registers may involve additional wiring across the semiconductor device (e.g., die), such that the registers are communicatively coupled to the corresponding memory components.

The I/O interface 106 may include a number of pins (e.g., 7 pins) to facilitate data communication with external components (e.g., the processing component, such as a processor). Particularly, the I/O interface 106 may receive the access commands via the pins. Moreover, data stored on the memory cells of the memory banks 102 may be transmitted to and/or retrieved from the memory banks 102 over the data path 134. The data path 134 may include a plurality of bi-directional data buses to one or more external devices via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
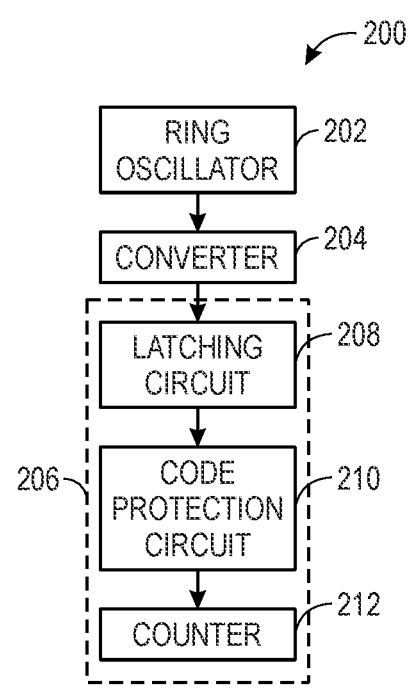
FIG. 2 is a functional block diagram of a time to digital circuit, in accordance with an embodiment of the present disclosure.

FIG. 2 depicts a functional block diagram of a time to digital circuit 200. Various electronic devices may include the time to digital circuit 200. The time to digital circuit 200 may measure a time of an event and/or measure a time difference between multiple events, among other time measurements. In some cases, the memory device 100 may include the time to digital circuit 200. For example, the DLL 118 of the memory device 100 may include the time to digital circuit 200. In specific cases, the DLL 118 of the memory device 100 may use the time to digital circuit 200 to provide the LCLK using a similar or different operating frequency based on receiving the CLK. The time to digital circuit may also be used to measure other timing parameters, such as transistor toggling speeds or other timing intervals of interest.

In any case, the time to digital circuit 200 may include a ring oscillator 202, a converter 204, and an encoder 206. The encoder 206 may include a latching circuit 208, a code protection circuit 210, and a counter 212. That said, it should be appreciated that in different embodiments, the time to digital circuit 200 may include additional or different functional block diagrams.

The ring oscillator 202 may provide (e.g., output) an odd number of parallel alternating signals to the converter 204 based on using an odd number of inverting circuits coupled in series. A signal may propagate through the odd number of inverting circuits coupled in series (e.g., cascaded) to provide the odd number of parallel alternating signals. Moreover, the signal may loop through the ring oscillator 202. For example, a first inverting circuit of the odd number of inverting circuits may receive an output of a last inverting circuit to form a feedback loop. A value of the signal may switch between logic 1 and logic 0 value when passing through each of the inverting circuits. The signal may propagate through the ring oscillator 202 using a first pattern based on the odd number of inverting circuits.

The first inverting circuit of the ring oscillator 202 may also receive a trigger signal. The trigger signal may be generated and/or provided based on a triggering event. In some cases, the ring oscillator 202 may change a pattern of providing the odd number of parallel alternating signals based on receiving a high trigger signal. In specific cases, the high trigger signal may indicate a duration of a time measurement of the event. For example, the trigger signal may remain high for the duration of the time measurement. In different cases, the ring oscillator 202 may change a pattern of providing the odd number of parallel alternating signals based on receiving a low trigger signal.

As mentioned above, the value of the signal may switch between logic 1 and logic 0 value when passing through each of the inverting circuits. For example, the ring oscillator 202 may provide the parallel alternating signals using alternating code. In some cases, the ring oscillator 202 may indicate the duration of an event based on changing a pattern of providing the alternating signals. For example, the ring oscillator 202 may provide the alternating signals using the first pattern when receiving a low trigger signal and provide the alternating signals using a second pattern when receiving the high trigger signal. Moreover, the downstream blocks may determine the duration of the event based on detecting the switching in pattern of providing the alternating signals to the downstream blocks.

In some cases, the time to digital circuit 200 may become susceptible to errors and incorrect time measurements when using the alternative signals. For example, a metastable condition of a circuit component, a setup timing violation of a signal continuously (e.g., repeatedly) switching between high and low values, among other things, may cause provision of erroneous alternating signals that may cause an incorrect time measurement.

Accordingly, the converter 204 may convert the alternating signals to consistent signals to facilitate error correction by the downstream blocks, as will be appreciated. For example, the converter 204 may include circuitry to receive a set of parallel alternating signals from the ring oscillator 202, convert the alternating signals to consistent signals, and provide parallel consistent signals to the latching circuit 208 of the encoder 206. In some cases, the converter 204 may provide the consistent signals using the Thermometer Code.

In some cases, the converter 204 may provide the consistent signals with consistent high signals when receiving the alternating signals with the first pattern (e.g., when the ring oscillator is receiving a low trigger signal). Moreover, the converter 204 may provide the consistent signals switching between high and low values based on a length of (e.g., a number of) the received parallel alternating signals when receiving the alternating signals with the second pattern (e.g., when the ring oscillator is receiving the high trigger signal). For example, the converter 204 may switch between providing the odd number of low signals followed by the odd number of high signals, and so forth, based on using the Thermometer Code to indicate a time associated with the high trigger signal.

The latching circuit 208 may latch a value of the parallel consistent signals received at each clock cycle. In some cases, the consistent signals (e.g., parallel consistent signals) latched at each clock cycle may include a number of consistent low signals followed by a number of consistent high signals (e.g., 000001111, 000011111, 000111111, and so on), a number of consistent high signals followed by a number of consistent low signals (e.g., 111000000, 111100000, 111110000, and so on), the odd number of the consistent low signals (e.g., 000000000), or the odd number of the consistent high signals (e.g., 111111111). In any case, the parallel consistent signals latched at each clock cycle may include zero or one transitions between the high and low signals.

In one example, each row of the Thermometer Code of Table 2 above depicts a value of the parallel consistent signals at different clock cycles. As depicted in Table 2, the parallel consistent signals may include zero or one transitions between the high and low signals at each respective clock cycle. The code protection circuit 210 may identify the erroneous signals by identifying more than one transition between the high and low signals, as will be appreciated. Accordingly, the converter 204 may provide the consistent signals to facilitate error correction by the downstream blocks In one embodiment, the clock cycle may correspond to a clock cycle of CLK provided to the DLL 118 of FIG. 1. In other embodiments, the latching circuit 208 may use a clock cycle of a different clock signal. In any case, the latching circuit 208 may provide the latched values of the consistent signals at a subsequent clock cycle to the code protection circuit 210.

As mentioned above, the code protection circuit 210 may identify and correct erroneous signals of the received parallel consistent signals. The code protection circuit 210 may include circuitry to identify the erroneous signals of the consistent signals based on comparing consecutive signals of the received parallel consistent signals. For example, multiple switching of the consistent signals, between the high and low values, may indicate an inconsistency according to the Thermometer Code specifications. Accordingly, the code protection circuit 210 may correct the erroneous signals of the consistent signals when the received parallel consistent signals includes multiple consecutive switching between the high and low values.

Moreover, the code protection circuit 210 may include circuitry to correct the identified erroneous signals. Subsequently, the code protection circuit 210 may provide the corrected consistent signals to the counter 212. Accordingly, the counter 212 may determine a time duration of the signal based on receiving the corrected consistent signals. In one example, the counter 212 may provide a final count of the time duration when the trigger signal becomes low. In another example, the counter 212 may continuously provide a count of the time duration until the trigger signal becomes low. The converter 204 and the code protection circuit 210 may improve an operational efficiency of the time to digital circuit 200 by measuring the duration of a time based on using the consistent signals.

Figure 3:
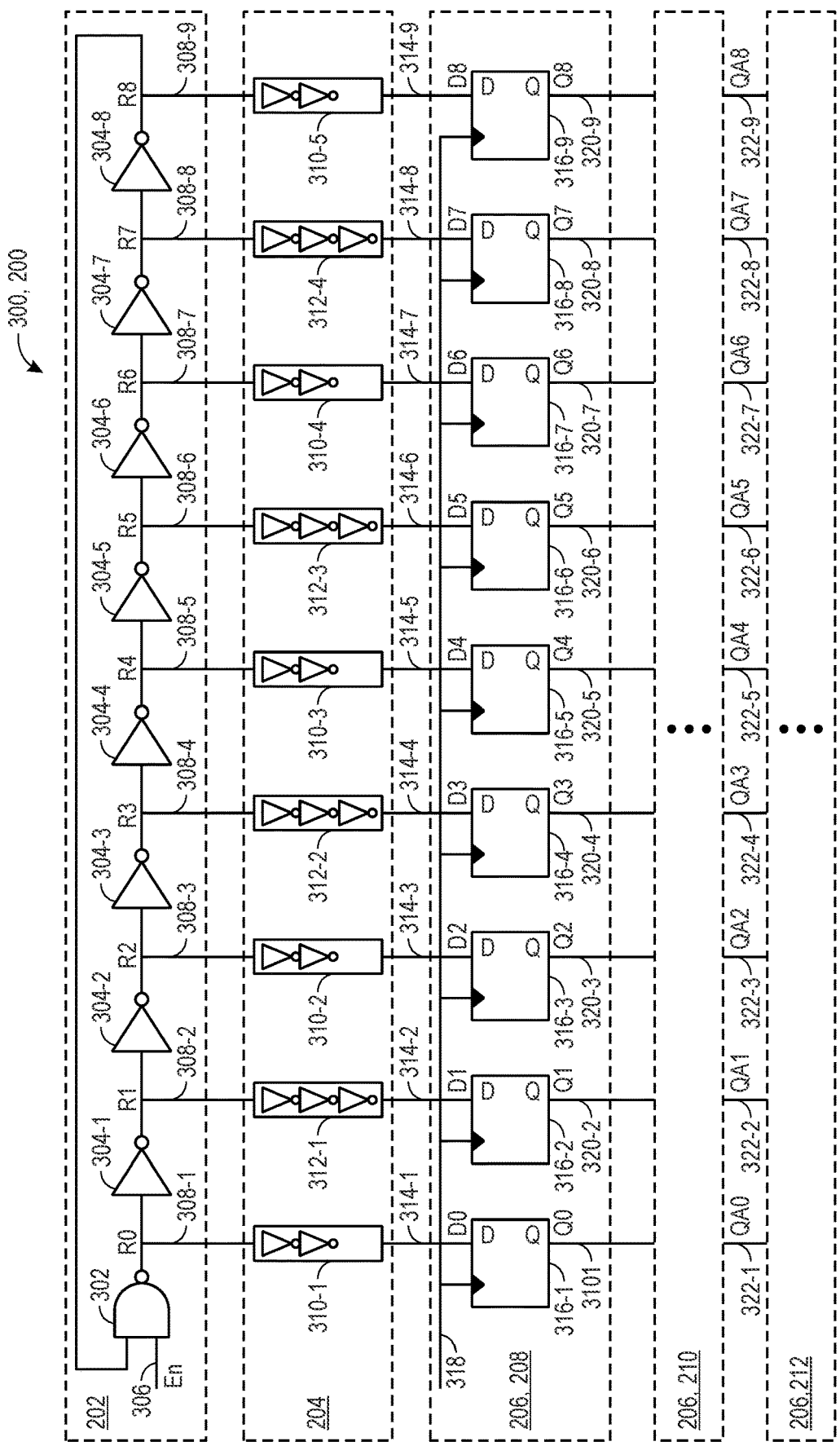
FIG. 3 is a schematic of the time to digital circuit of FIG. 2, in accordance with an embodiment of the present disclosure.

With the foregoing in mind, FIG. 3 depicts a schematic 300 of one embodiment of the time to digital circuit 200. In particular, the depicted portion of the time to digital circuit 200 of FIG. 3 may include a schematic of the ring oscillator 202, a schematic of the converter 204, a schematic of the latching circuit 208, a block diagram of the code protection circuit 210, and a block diagram of the counter 212. The ring oscillator 202 may include an odd number of inverting circuits coupled in series. In the depicted embodiment, the ring oscillator 202 may include a NAND gate 302 and eight inverters 304-1, 304-2, 304-3, 304-4, 304-5, 304-5, 304-6, 304-7, and 304-8.

The NAND gate 302 and the inverters 304-1, 304-2, 304-3, 304-4, 304-5, 304-5, 304-6, 304-7, and 304-8 may be coupled in series. Each of the NAND gate 302 and the inverters 304-1, 304-2, 304-3, 304-4, 304-5, 304-5, 304-6, 304-7, and 304-8 may receive an output signal from a respective inverting circuit coupled thereto such that the NAND gate 302 may receive (e.g., input) an output of the inverter 304-8.

The NAND gate 302 may also receive a trigger signal (EN) 306. The time to digital circuit 200 may measure a time associated with receiving a high trigger signal (EN) 306. For example, the ring oscillator may provide alternating signals (R0-R8) 308-1, 308-2, 308-3, 308-4, 308-5, 308-6, 308-7, 308-8, and 308-9 to the converter 204 in parallel at each clock cycle (e.g., T0, T1, T2, etc.). An example embodiment of the trigger signal (EN) 306 and the alternating signals (R0-R8) 308-1, 308-2, 308-3, 308-4, 308-5, 308-6, 308-7, 308-8, and 308-9 is provided in Table 3 below.

Table 3 depicts consecutive steps in time (e.g., T1, T2, T3, T4, T5, T6, T7, T8, and T9) when the ring oscillator 202 is operating. For example, a high or low signal may propagate through the NAND gate 302 and the inverters 304-1, 304-2, 304-3, 304-4, 304-5, 304-5, 304-6, 304-7, and 304-8 consecutively in the consecutive steps in time shown in the Table 3 below. That said, each of the AND gate 302 and the inverters 304-1, 304-2, 304-3, 304-4, 304-5, 304-5, 304-6, 304-7, and 304-8 may use a different amount of time for propagating the signal to the subsequent circuit.

In the Table 3 below, the ring oscillator 202 may provide the alternating signals (R0-R8) 308-1, 308-2, 308-3, 308-4, 308-5, 308-6, 308-7, 308-8, and 308-9 using a first pattern when the NAND gate 302 is receiving a low trigger signal (EN) 306 (e.g., T0, T1, T2, T8, and T9 at the Table 3). Moreover, the ring oscillator 202 may provide the alternating signals (R0-R8) 308-1, 308-2, 308-3, 308-4, 308-5, 308-6, 308-7, 308-8, and 308-9 using a second pattern when receiving a high trigger signal (EN) 306 (e.g., T3, T4, T5, T6, and T7 at the Table 3). A transition between the first pattern and the second pattern may indicate a change of the value of the trigger signal (EN) 306. Such transition is shown with respect to the signals in different steps in time in the Tables 3 below.

As mentioned above, a duration of the high trigger signal (EN) 306 may indicate a duration of an event. The NAND gate 302 and the, 304-2, 304-3, 304-4, 304-5, 304-5, 304-6, 304-7, and 304-8 may provide the alternating signals (R0-R8) 308-1, 308-2, 308-3, 308-4, 308-5, 308-6, 308-7, 308-8, and 308-9 at times T1, T2, T3, T4, T5, T6, T7, T8, and T9, respectively. In the example embodiment of the Table 3, the NAND gate 302 may receive the high trigger signal (EN) 306 and the alternating signal 308-9 at a time T4 (e.g., a step in time as the logic levels propagate around the ring oscillator 202 loop). As mentioned above, each of the times T1, T2, T3, T4, T5, T6, T7, T8, and T9 may be a step in time depicting propagation of alternating logic levels through, and looped around, the ring oscillator 202.

Accordingly, the ring oscillator 202 may change a pattern of providing the alternating signals (R0-R8) 308-1, 308-2, 308-3, 308-4, 308-5, 308-6, 308-7, 308-8, and 308-9 based on receiving the high trigger signal (EN) 306. The NAND gate 302 and the inverters 304-1, 304-2, 304-3, 304-4, 304-5, 304-5, 304-6, 304-7, and 304-8 of the ring oscillator 202 may provide the alternating signals (R0-R8) 308-1, 308-2, 308-3, 308-4, 308-5, 308-6, 308-7, 308-8, and 308-9 using the second pattern.

For example, the NAND gate 302 may provide a high R0 signal at each step in time (e.g., T0, T1, T2, T8, and T9) when providing the R0 signal using the first pattern based on receiving the low trigger signal (EN) 306. However, the NAND gate 302 may provide a low R0 signal at each step in time (e.g., T3-T7) when providing the R0 signal using the second pattern based on receiving the high trigger signal (EN) 306.

TABLE 3

| (R8) | EN | R0 | R1 | R2 | R3 | R4 | R5 | R6 | R7 | R8 |
|---|---|---|---|---|---|---|---|---|---|---|
| T0 | N/A | LOW | HIGH | LOW | HIGH | LOW | HIGH | LOW | HIGH | LOW | HIGH |
| T1 | HIGH | LOW | HIGH | LOW | HIGH | LOW | HIGH | LOW | HIGH | LOW | HIGH |
| T2 | HIGH | LOW | HIGH | LOW | HIGH | LOW | HIGH | LOW | HIGH | LOW | HIGH |
| T3 | HIGH | HIGH | LOW | LOW | HIGH | LOW | HIGH | LOW | HIGH | LOW | HIGH |
| T4 | HIGH | HIGH | LOW | HIGH | HIGH | LOW | HIGH | LOW | HIGH | LOW | HIGH |
| T5 | HIGH | HIGH | LOW | HIGH | LOW | LOW | HIGH | LOW | HIGH | LOW | HIGH |
| T6 | HIGH | HIGH | LOW | HIGH | LOW | HIGH | HIGH | LOW | HIGH | LOW | HIGH |
| T7 | HIGH | HIGH | LOW | HIGH | LOW | HIGH | LOW | LOW | HIGH | LOW | HIGH |
| T8 | HIGH | LOW | HIGH | HIGH | LOW | HIGH | LOW | HIGH | HIGH | LOW | HIGH |
| T9 | HIGH | LOW | HIGH | LOW | LOW | HIGH | LOW | HIGH | LOW | LOW | HIGH |

In any case, the converter 204 may receive the alternating signals (R0-R8) 308-1, 308-2, 308-3, 308-4, 308-5, 308-6, 308-7, 308-8, and 308-9. In some cases, a phase splitter circuit may include a first circuit portion including the inverting delay path and a second circuit portion including the non-inverting delay path. In the depicted embodiment of FIG. 3, the converter 204 may include inverting and non-inverting delay paths with matched propagation delays. As such, the depicted inverting and the non-inverting delay paths may be referred to as phase splitter halves hereinafter.

The converter 204 may use phase splitter halves 310-1, 310-2, 310-3, 310-4, 310-5, 312-1, 312-2, 312-3, and 312-4 to convert the received alternating signals (R0-R8) 308-1, 308-2, 308-3, 308-4, 308-5, 308-6, 308-7, 308-8, and 308-9 to consistent signals. Accordingly, the phase splitter halves 310-1, 310-2, 310-3, 310-4, 310-5, 312-1, 312-2, 312-3, and 312-4 may provide consistent signals (D0-D8) 314-1, 314-2, 314-3, 314-4, 314-5, 314-6, 314-7, 314-8, and 314-9. That said, in alternative or additional cases, the converter 204 may include other circuitry to provide the consistent signals (D0-D8) 314-1, 314-2, 314-3, 314-4, 314-5, 314-6, 314-7, 314-8, and 314-9.

Referring back to the Table 3 above, the ring oscillator 202 may provide the alternating signals (R0-R8) 308-1, 308-2, 308-3, 308-4, 308-5, 308-6, 308-7, 308-8, and 308-9 using alternating code. As shown in the example embodiment of the Table 3, consecutive alternating signals (R0-R8) 308-1, 308-2, 308-3, 308-4, 308-5, 308-6, 308-7, 308-8, and 308-9 may switch between the high and low values (e.g., using the first pattern or the second pattern). Accordingly, in one embodiment, the phase splitter halves 310-1, 310-2, 310-3, 310-4, and 310-5 may include two inverting circuits (e.g., inverters) and the phase splitter halves 312-1, 312-2, 312-3, and 312-4 may include three inverting circuits (e.g., inverters) to convert the alternating signals (R0-R8) 308-1, 308-2, 308-3, 308-4, 308-5, 308-6, 308-7, 308-8, and 308-9 to the consistent signals (D0-D8) 314-1, 314-2, 314-3, 314-4, 314-5, 314-6, 314-7, 314-8, and 314-9.

Table 4 below includes an example of the consistent signals (D0-D8) 314-1, 314-2, 314-3, 314-4, 314-5, 314-6, 314-7, 314-8, and 314-9 in consecutive steps in time T0, T1, T2, T3, T4, T5, T6, T7, T8, and T9. The converter 204 may provide high consistent signals (D0-D8) 314-1, 314-2, 314-3, 314-4, 314-5, 314-6, 314-7, 314-8, and 314-9 when the NAND gate 302 is receiving a low trigger signal (EN) 306. As mentioned above, the ring oscillator 202 may provide the alternating signals (R0-R8) 308-1, 308-2, 308-3, 308-4, 308-5, 308-6, 308-7, 308-8, and 308-9 using the first pattern when the NAND gate 302 receives a low trigger signal (EN) 306. Accordingly, the converter 204 may use the phase splitter halves 310-1, 310-2, 310-3, 310-4, 310-5, 312-1, 312-2, 312-3, and 312-4 to provide the high consistent signals (D0-D8) 314-1, 314-2, 314-3, 314-4, 314-5, 314-6, 314-7, 314-8, and 314-9 when receiving the alternating signals (R0-R8) 308-1, 308-2, 308-3, 308-4, 308-5, 308-6, 308-7, 308-8, and 308-9 using the first pattern.

When the NAND gate 302 receives a high trigger signal (EN) 306, the converter 204 may switch providing the consistent signals (D0-D8) 314-1, 314-2, 314-3, 314-4, 314-5, 314-6, 314-7, 314-8, and 314-9 with low values. In some cases, the converter 204 may provide a number of low consistent signals (D0-D8) 314-1, 314-2, 314-3, 314-4, 314-5, 314-6, 314-7, 314-8, and 314-9 based on a length of (e.g., a number of) the received parallel alternating signals (R0-R8) 308-1, 308-2, 308-3, 308-4, 308-5, 308-6, 308-7, 308-8, and 308-9 in response to the NAND gate 302 receiving continuing high trigger signal (EN) 306. For example, the converter 204 may switch between providing the odd number of low signals followed by the odd number of high signals, and so forth, based on using the Thermometer Code to indicate a time measurement of the high trigger signal.

With the foregoing in mind, the ring oscillator 202 may switch from using the first pattern for providing the alternating signals (R0-R8) 308-1, 308-2, 308-3, 308-4, 308-5, 308-6, 308-7, 308-8, and 308-9 to the second pattern based on receiving the trigger signal 306. Accordingly, the converter 204 may transition from providing high consistent signals (D0-D8) 314-1, 314-2, 314-3, 314-4, 314-5, 314-6, 314-7, 314-8, and 314-9 to low consistent signals (D0-D8) 314-1, 314-2, 314-3, 314-4, 314-5, 314-6, 314-7, 314-8, and 314-9 based on the switch. The transition between high and low signals may propagate through the consistent signals (D0-D8) 314-1, 314-2, 314-3, 314-4, 314-5, 314-6, 314-7, 314-8, and 314-9 in the consecutive steps in time T0, T1, T2, T3, T4, T5, T6, T7, T8, and T9, as will be appreciated.

For example, as illustrated in the example embodiment of the Table 4 below, the phase splitter half 310-1 may receive the alternating signal (R0) 308-1 provided with the second pattern. The phase splitter half 310-1 may provide a low consistent signal (D0) 314-1 at a first step in time (e.g., T3) based on receiving the alternating signal (R0) 308-1 with the second pattern. Subsequently, the phase splitter half 312-2 may receive the alternating signal (R1) 308-2 provided with the second pattern. The phase splitter half 312-1 may provide a low consistent signal (D1) 314-2 at a subsequent step in time (e.g., T4) based on receiving the alternating signal (R1) 308-2 with the second pattern.

Similarly, in subsequent steps in time (e.g., T5, T6, T7, T8, T9, T10), the phase splitter halves 310-2, 312-2, 310-3, 312-3, 310-4, 312-4, and 310-5 of the converter 204 may receive the alternating signals (R2-R8) 308-3, 308-4, 308-5, 308-6, 308-7, 308-8, and 308-9 provided with the second pattern. Accordingly, based on receiving the alternating signals (R2-R8) 308-3, 308-4, 308-5, 308-6, 308-7, 308-8, and 308-9 with the second pattern, the phase splitter halves 310-2, 312-2, 310-3, 312-3, 310-4, 312-4, and 310-5 may each provide a low consistent signal (D2-D8) 314-3, 314-4, 314-5, 314-6, 314-7, 314-8, and 314-9 at a respective subsequent step in time (e.g., T5, T6, T7, T8, T9, and T10).

Accordingly, at each step in time (e.g., T0, T1, T2, T3, T4, T5, T6, T7, T8, T9, or T10), the phase splitter halves 310-1, 310-2, 310-3, 310-4, 310-5, 312-1, 312-2, 312-3, and 312-4 may provide the consistent signals (D0-D8) 314-1, 314-2, 314-3, 314-4, 314-5, 314-6, 314-7, 314-8, and 314-9 with only high signals, only low signals, or only one transition between the high and low signals. Such transition between the high and low signals is illustrated in the Table 4 below, propagating through the consistent signals (D0-D8) 314-1, 314-2, 314-3, 314-4, 314-5, 314-6, 314-7, 314-8, and 314-9, as receiving the alternating signals (R0-R8) 308-1, 308-2, 308-3, 308-4, 308-5, 308-6, 308-7, 308-8, and 308-9 using the second pattern at each step in time. Providing the consistent signals (D0-D8) 314-1, 314-2, 314-3, 314-4, 314-5, 314-6, 314-7, 314-8, and 314-9 using the Thermometer Code may facilitate error correction by the code protection circuit 210, as will be appreciated.

TABLE 4

| | D0 | D1 | D2 | D3 | D4 | D5 | D6 | D7 | D8 |
|---|---|---|---|---|---|---|---|---|---|
| T0 | HIGH | HIGH | HIGH | HIGH | HIGH | HIGH | HIGH | HIGH | HIGH |
| T1 | HIGH | HIGH | HIGH | HIGH | HIGH | HIGH | HIGH | HIGH | HIGH |
| T2 | HIGH | HIGH | HIGH | HIGH | HIGH | HIGH | HIGH | HIGH | HIGH |
| T3 | LOW | HIGH | HIGH | HIGH | HIGH | HIGH | HIGH | HIGH | HIGH |
| T4 | LOW | LOW | HIGH | HIGH | HIGH | HIGH | HIGH | HIGH | HIGH |
| T5 | LOW | LOW | LOW | HIGH | HIGH | HIGH | HIGH | HIGH | HIGH |
| T6 | LOW | LOW | LOW | LOW | HIGH | HIGH | HIGH | HIGH | HIGH |
| T7 | LOW | LOW | LOW | LOW | LOW | HIGH | HIGH | HIGH | HIGH |
| T8 | HIGH | LOW | LOW | LOW | LOW | LOW | HIGH | HIGH | HIGH |
| T9 | HIGH | HIGH | LOW | LOW | LOW | LOW | LOW | HIGH | HIGH |
| T10 | HIGH | HIGH | HIGH | LOW | LOW | LOW | LOW | LOW | HIGH |

In any case, the converter 204 may provide the consistent signals (D0-D8) 314-1, 314-2, 314-3, 314-4, 314-5, 314-6, 314-7, 314-8, and 314-9 to the latching circuit 208 of the encoder 206 in parallel. The latching circuit 208 may include latches 316-1, 316-2, 316-3, 316-4, 316-5, 316-5, 316-6, 316-7, 316-8, and 316-9. As such, the latches 316-1, 316-2, 316-3, 316-4, 316-5, 316-5, 316-6, 316-7, 316-8, and 316-9 may receive (e.g., latch) the consistent signals (D0-D8) 314-1, 314-2, 314-3, 314-4, 314-5, 314-6, 314-7, 314-8, and 314-9 in parallel. In the depicted embodiment, the latches 316-1, 316-2, 316-3, 316-4, 316-5, 316-5, 316-6, 316-7, 316-8, and 316-9 may also receive a clock signal 318. In different cases, the clock signal may be CLK or LCLK described above in FIG. 1, or any other viable clock signal.

For example, the latches 316-1, 316-2, 316-3, 316-4, 316-5, 316-5, 316-6, 316-7, 316-8, and 316-9 may clock-in (e.g., latch) the parallel consistent signals (D0-D8) 314-1, 314-2, 314-3, 314-4, 314-5, 314-6, 314-7, 314-8, and 314-9 based on the clock signal 318. Subsequently, the latches 316-1, 316-2, 316-3, 316-4, 316-5, 316-5, 316-6, 316-7, 316-8, and 316-9 may provide latched signals (Q0-Q8) 320-1, 320-2, 320-3, 320-4, 320-5, 320-6, 320-7, 320-8, and 320-9 to the code protection circuit 210 in parallel.

The latches 316-1, 316-2, 316-3, 316-4, 316-5, 316-5, 316-6, 316-7, 316-8, and 316-9 may provide the latched signals (Q0-Q8) 320-1, 320-2, 320-3, 320-4, 320-5, 320-6, 320-7, 320-8, and 320-9 using Thermometer Code, for example, to indicate an incrementing integer value of a duration of the time associated with an event. However, in some cases, the latched signals (Q0-Q8) 320-1, 320-2, 320-3, 320-4, 320-5, 320-6, 320-7, 320-8, and 320-9 may include one or more erroneous signals. In such cases, the code protection circuit 210 may correct the one or more erroneous signals by correcting the Thermometer Code. An example embodiment of the code protection circuit 210 is described below with respect to FIG. 7.

In any case, the code protection circuit 210 may provide corrected signals (QA0-QA8) 322-1, 322-2, 322-3, 322-4, 322-5, 322-6, 322-7, 322-8, and 322-9 to the counter 212. In some cases, the counter 212 may determine the integer value of the duration of the time associated with the event based on receiving the corrected signals (QA0-QA8) 322-1, 322-2, 322-3, 322-4, 322-5, 322-6, 322-7, 322-8, and 322-9. For example, the counter 212 may determine the duration of the time associated with the event based on decoding the Thermometer Code. Accordingly, the time to digital circuit 200 may provide a corrected time duration measurement of the event by correcting the consistent signals (D0-D8) 314-1, 314-2, 314-3, 314-4, 314-5, 314-6, 314-7, 314-8, and 314-9 provided using the Thermometer Code.

Figure 4:
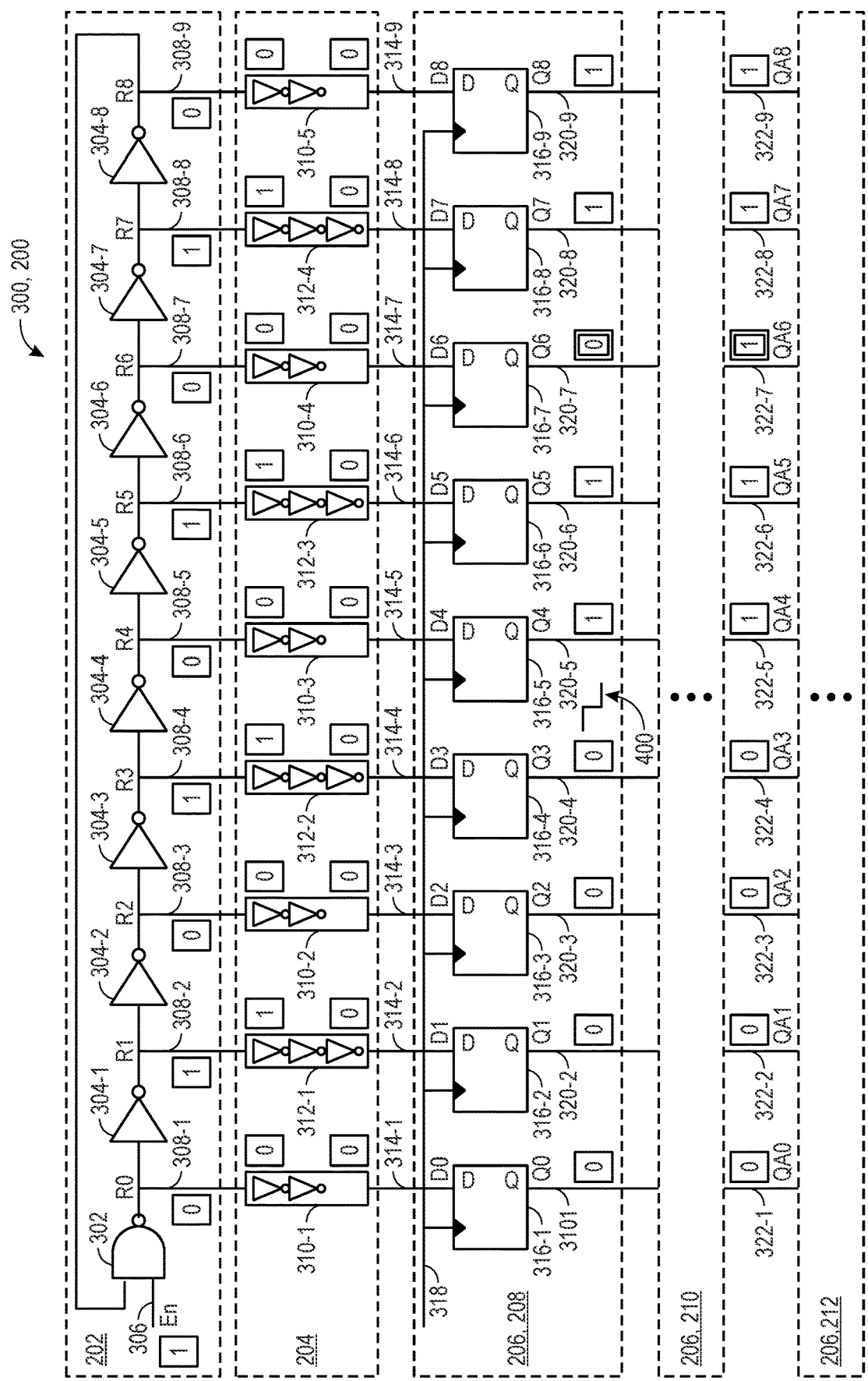
FIG. 4 is an embodiment of the schematic of FIG. 3 including example signals when receiving a high trigger signal (EN), in accordance with an embodiment of the present disclosure.

FIG. 4 depicts an example embodiment of the schematic 300 including example signals. The example embodiment of the schematic 300 depicts the example signals when the ring oscillator 202 receives a high trigger signal (EN) 306. The example signals are depicted to illustrate parallel flow of the alternating signals (R0-R8) 308-1, 308-2, 308-3, 308-4, 308-5, 308-6, 308-7, 308-8, and 308-9 through the converter 204, the latching circuit 208, and the code protection circuit 210 in response to receiving a high trigger signal.

A strobe 400 is depicted to indicate propagation of the transition between the first pattern and the second pattern of providing the alternating signals (R0-R8) 308-1, 308-2, 308-3, 308-4, 308-5, 308-6, 308-7, 308-8, and 308-9 in response to receiving a high trigger signal by the NAND gate 302. For example, the inverters 304-4, 304-5, 304-6, 304-7, and 304-8 may provide the alternating signals (R4-R8) 308-5, 308-6, 308-7, 308-8, and 308-9 using the first pattern. Moreover, the NAND gate 302 and the inverters 304-1, 304-2, and 304-3 may provide the alternating signals (R0-R3) 308-1, 308-2, 308-3, and 308-4 using the second pattern.

In the depicted embodiment, the converter 204 may use the phase splitter halves 310-1, 312-1, 310-2, and 312-2 to provide the low consistent signals (D0-D3) 314-1, 314-2, 314-3, and 314-4. The converter 204 may provide the low consistent signals (D0-D3) 314-1, 314-2, 314-3, and 314-4 in response to receiving the alternating signals (R0-R3) 308-1, 308-2, 308-3, and 308-4 using the second pattern.

Moreover, the converter 204 may use the phase splitter halves 310-3, 312-3, 310-4, 312-4, and 310-5 to provide the high consistent signals (D4-D8) 314-5, 314-6, 314-7, 314-8, and 314-9. The converter 204 may provide the high consistent signals (D4-D8) 314-5, 314-6, 314-7, 314-8, and 314-9 in response to receiving the alternating signals (R4-R8) 308-5, 308-6, 308-7, 308-8, and 308-9 using the first pattern.

A strobe signal 402 is also depicted to show the transition at an output of the latching circuit 208 based on the parallel flow of the alternating signals (R0-R8) 308-1, 308-2, 308-3, 308-4, 308-5, 308-6, 308-7, 308-8, and 308-9 through the converter 204 and the latching circuit 208. Accordingly, the latches 316-1, 316-2, 316-3, and 316-4 may provide low latched signals (Q0-Q3) 320-1, 320-2, 320-3, and 320-4 based on receiving the low consistent signals (D0-D3) 314-1, 314-2, 314-3, and 314-4. Moreover, the latches 316-5, 316-6, 316-7, 316-8, and 316-9 may provide high latched signals (Q4-Q8) 320-5, 320-6, 320-7, 320-8, and 320-9 based on receiving the high consistent signals (D4-D8) 314-5, 314-6, 314-7, 314-8, and 314-9.

However, in the depicted example, the latched signal (Q5) 320-6 is erroneously low. For example, a metastable condition of the latch 316-7, a timing violation of the consistent signal 314-7, among other things, may cause the erroneously low latched signal (Q5) 320-6. As mentioned above, the Thermometer Code may use one transition between high and low values in consecutive signals. Accordingly, the code protection circuit 210 may correct an erroneous signal (e.g., the erroneously low latched signal (Q5) 320-6) based on comparing consecutive parallel signals. Subsequently, the code protection circuit 210 may provide a corrected signal (e.g., high latched signal (Q5) 320-6) to the downstream components (e.g., the counter 212).

In some cases, the code protection circuit 210 may correct the erroneous latched signal (Q5) 320-6 by comparing the latched signals (Q4-6) 320-5, 320-6, and 320-7. For example, the code protection circuit 210 may correct the erroneous latched signal (Q5) 320-6 based on determining multiple transitions between high and low values when comparing the latched signals (Q4-6) 320-5, 320-6, and 320-7. Subsequently, the code protection circuit 210 may provide the corrected signals (QA0-QA8) 322-1, 322-2, 322-3, 322-4, 322-5, 322-6, 322-7, 322-8, and 322-9 including the high corrected signal (QA5) 322-6. Accordingly, the counter 212 may provide a correct time measurement of the duration of the event based on receiving the corrected signals (QA0-QA8) 322-1, 322-2, 322-3, 322-4, 322-5, 322-6, 322-7, 322-8, and 322-9.

Figure 5:
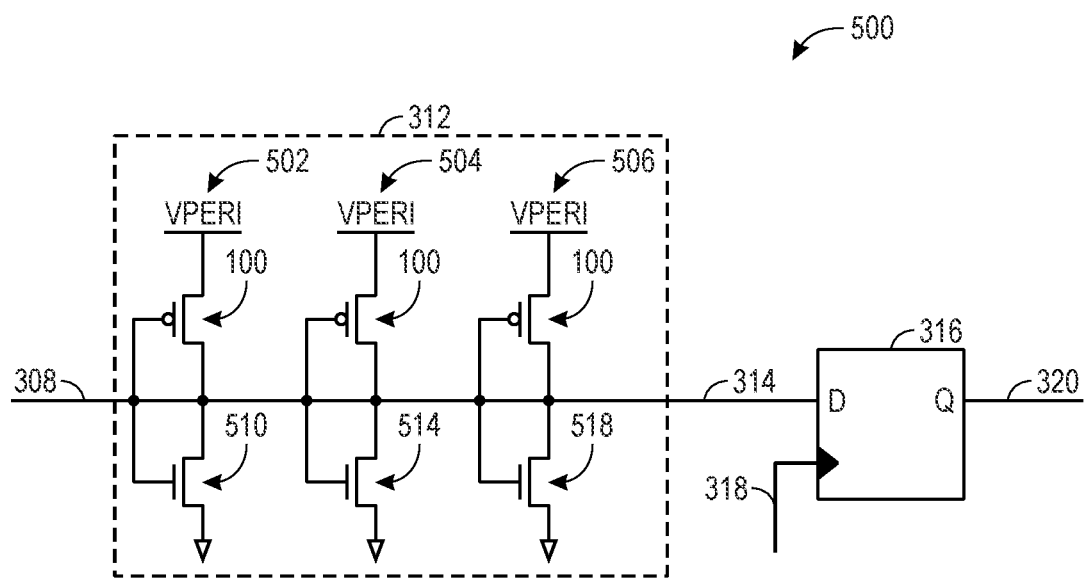
FIG. 5 is a schematic of a phase splitter half associated with the embodiment of the FIG. 3 including three inverting circuits, in accordance with an embodiment of the present disclosure.

FIG. 5 depicts a schematic 500 of the phase splitter half 312 (e.g., the phase splitter halves 312-1, 312-2, 312-3, and 312-4) and the latch 316 (e.g., the latches 316-2, 316-4, 316-6, and 316-8). As mentioned above, in some cases, the phase splitter half 312 may include three inverters. In the depicted embodiment, the phase splitter half 312 may include inverting circuits 502, 504, and 506 coupled in series.

The inverting circuit 502 may include switches 508 and 510, the inverting circuit 504 may include switches 512 and 514, and the inverting circuit 506 may include switches 516 and 518. In different embodiments, the switches 508, 510, 512, 514, 516, and 518 may be variable resistance transistors, MOSFETs, a combination thereof, or any other viable switching elements.

In any case, each of the inverting circuits 502, 504, and 506 may invert the alternating signal 308 based on flipping the polarity of the alternating signal 308 by providing the peripheral voltage (VPERI) or a ground voltage. Moreover, each of the inverting circuits 502, 504, and 506 may flip the value or polarity of the alternating signal 308 based on a respective delay. The phase splitter half 312 may flip the alternating signal 308 (e.g., based on flipping the alternating signal 308 three times) to provide the consistent signal 314.

That said, in alternative or additional embodiments, the time to digital circuit 200 may use a different inverting circuit and/or phase splitter half 312. Moreover, in alternative or additional embodiments, the phase splitter half 312 may include a different number of odd inverting circuits. In any case, the phase splitter half 312 may flip the alternating signal 308 to provide the consistent signal 314. Moreover, the latch 316 may provide the latched signal 320 based on receiving the consistent signal 314 and the clock signal 318.

Figure 6:
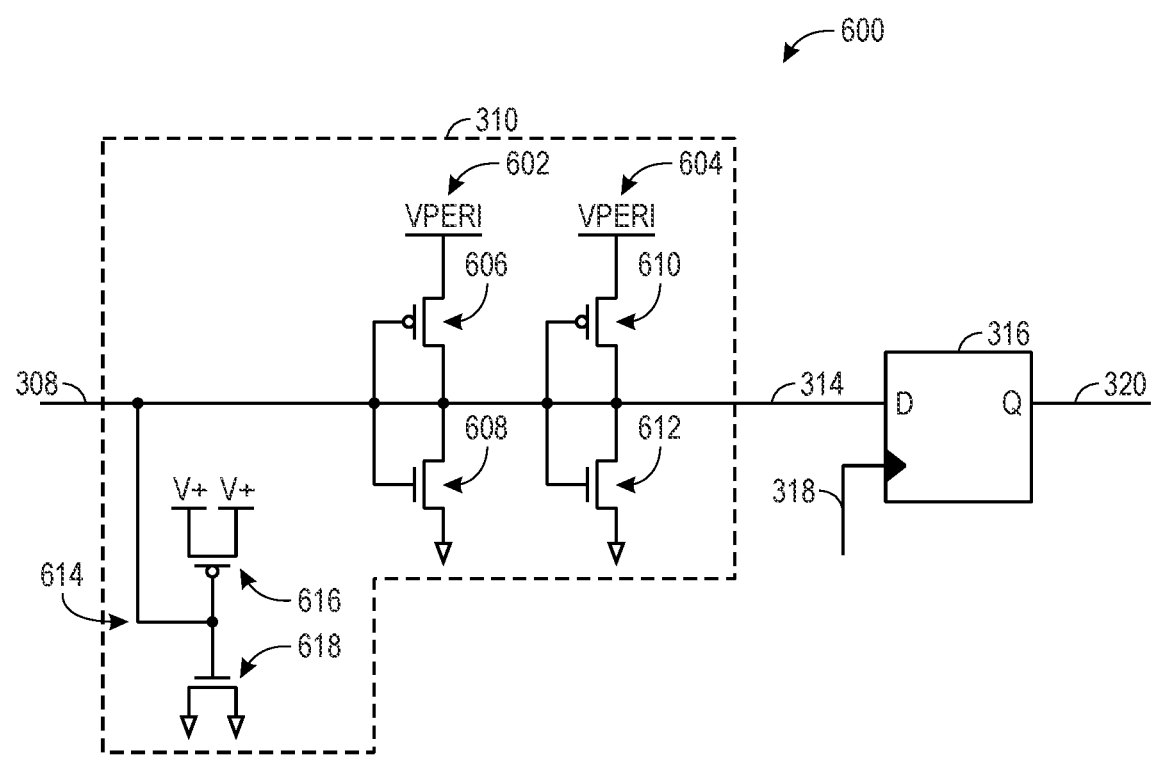
FIG. 6 is a schematic of a phase splitter half associated with the embodiment of the FIG. 3 including two inverting circuits, in accordance with an embodiment of the present disclosure.

FIG. 6 depicts a schematic 600 of the phase splitter half 310 (e.g., the phase splitter halves 310-1, 310-2, 310-3, 310-4, and 310-5) and the latch 316 (e.g., the latches 316-1, 316-3, 316-5, 316-7, and 316-9). As mentioned above, in some cases, the phase splitter half 310 may include two inverters. In the depicted embodiment, the phase splitter half 310 may include inverting circuits 602 and 604 coupled in series.

The inverting circuit 602 may include switches 606 and 608 and the inverting circuit 604 may include switches 610 and 612. In different embodiments, the switches 606, 608, 610, and 612 may be variable resistance transistors, MOSFETs, a combination thereof, or any other viable switch. In the depicted embodiment, each of the inverting circuit 602 and 604 may invert the alternating signal 308 based on flipping a polarity or value of the alternating signal by providing the peripheral voltage (VPERI) or a ground voltage. The phase splitter half 312 may provide the alternating signal 308 (e.g., based on flipping the alternating signal 308 twice) to provide the consistent signal 314.

Moreover, similar to the inverting circuits 502, 504, and 506, each of the inverting circuits 602 and 604 may flip the value of the alternating signal 308 based on a respective delay. However, in some cases, the two inverting circuits 602 and 604 of the phase splitter half 310 may provide a smaller delay compared to the three inverting circuits 502, 504, and 506 of the phase splitter half 312. Accordingly, in such cases, the phase splitter half 312 may include a delay circuit 614 to adjust the delay of the phase splitter half 312 based on the delay of the phase splitter half 310. For example, the delay circuit 614 may include a load circuit, including switches 616 and 618, to provide the delay.

That said, in alternative or additional embodiments, the time to digital circuit 200 may use a different delay circuit, inverting circuits, and/or phase splitter halves 310. Moreover, in alternative or additional embodiments, the phase splitter half 310 may include any other even number of inverting circuits. However, such even number of inverting circuits of the phase splitter half 310 may correspond to the odd number of inverting circuits of the phase splitter half 312. Furthermore, the inverting and non-inverting phase splitter halves 312 and 310 may provide the consistent signals 314 based on a similar time delay. Accordingly, the inverting and non-inverting phase splitter halves 312 and 310 may facilitate providing the consistent signals 314 in parallel to the downstream components.

Moreover, the latch 316 may provide the latched signal 320 based on receiving the consistent signal 314 and the clock signal 318. Accordingly, the phase splitter half 310 and the phase splitter half 312 may convert the alternating signals 308 to the consistent signals 314. The phase splitter half 310 and the phase splitter half 312 may output the consistent signals 314 to provide the Thermometer Code.

Figure 7:
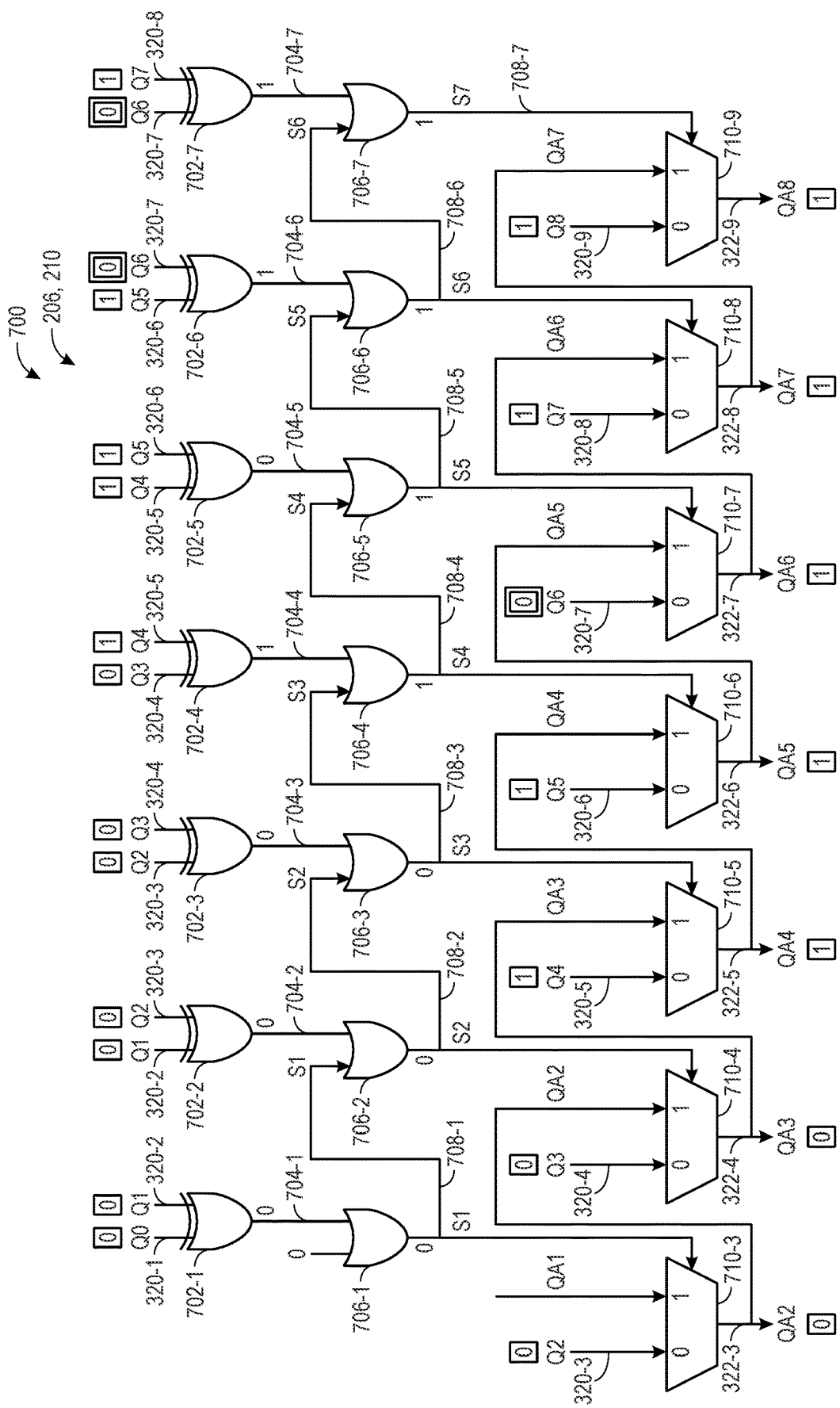
FIG. 7 is a schematic of a portion of a code protection circuit of the time to digital circuit of FIG. 3, in accordance with an embodiment of the present disclosure.

FIG. 7 depicts a schematic 700 of a portion of the code protection circuit 210 of the time to digital circuit 200. As mentioned above, the code protection circuit 210 may correct erroneous input signals (e.g., the erroneous latched signals 320) according to the Thermometer Code. The code protection circuit 210 may include comparison circuitry (e.g., redundancy check circuitry) to correct the erroneous consistent signals provided using the Thermometer code. For example, the Thermometer Code may use a single transition between multiple consecutive signals. Accordingly, the code protection circuit 210 may correct the inconsistent input signals associated with multiple transitions between high and low values. An example of the Thermometer Code is provided in the Table 2 above.

With the foregoing in mind, the schematic 700 may include XOR gates 702-1, 702-2, 702-3, 702-4, 702-5, 702-6, and 702-7. Each of the XOR gates 702-1, 702-2, 702-3, 702-4, 702-5, 702-6, and 702-7 may receive two consecutive latched signals 320. The latches 316 of the latching circuit 208 may provide the latched signals 320, as described above with respect to FIG. 3 and depicted in FIG. 4.

In particular, the XOR gate 702-1 may receive the latched signals (Q0) 320-1 and (Q1) 320-2. The XOR gate 702-2 may receive the latched signals (Q1) 320-2 and (Q2) 320-3. The XOR gate 702-3 may receive the latched signals (Q3) 320-3 and (Q3) 320-4. The XOR gate 702-4 may receive the latched signals (Q3) 320-4 and (Q4) 320-5. The XOR gate 702-5 may receive the latched signals (Q4) 320-5 and (Q5) 320-6. The XOR gate 702-6 may receive the latched signals (Q5) 320-6 and (Q6) 320-7, and the XOR gate 702-7 may receive the latched signals (Q6) 320-7 and (Q7) 320-8.

Each of the XOR gates 702-1, 702-2, 702-3, 702-4, 702-5, 702-6, and 702-7 may provide a respective XOR output signal 704-1, 704-2, 704-3, 704-4, 704-5, 704-6, and 704-7. The XOR gates 702-1, 702-2, 702-3, 702-4, 702-5, 702-6, and 702-7 may provide a respective high XOR output signal 704-1, 704-2, 704-3, 704-4, 704-5, and 704-6 when receiving a high and a low values of the respective input signal. Accordingly, the XOR gates 702-1, 702-2, 702-3, 702-4, 702-5, 702-6, and 702-7 may provide a respective high XOR output signal 704-1, 704-2, 704-3, 704-4, 704-5, and 704-6 when determining a transition between multiple consecutive latched signals 320.

In the depicted embodiment, the XOR gates 702-4, 702-5, and 702-6 may provide a high XOR output signal 704-4, 704-5, and 704-6. The XOR gate 702-4 may provide the high XOR output signal 704-4 based on a transition between the value of the latched signals (Q3) 320-4 and (Q4) 320-5. Moreover, the XOR gate 702-5 may provide the high XOR output signal 704-5 based on a transition between the value of the latched signals (Q4) 320-5 and (Q5) 320-6. Furthermore, the XOR gate 702-6 may provide the high XOR output signal 704-6 based on a transition between the value of the latched signals (Q5) 320-6 and (Q6) 320-7. In particular, in the depicted embodiment, the high XOR output signals 704-5 and 704-6 are generated based on the erroneously low latched signal (Q5) 320-6. Moreover, the code protection circuit 210 may use the high XOR output signals 704-5 and 704-6 to correct the erroneously low latched signal (Q5) 320-6 and provide the corrected signal (QA5) 322-6 instead.

Each of OR gates 706-1, 706-2, 706-3, 706-4, 706-5, 706-6, and 706-7 may receive a respective XOR output signal 704-1, 704-2, 704-3, 704-4, 704-5, 704-6, and 704-7 and an output of a previous OR gate 706 (e.g., selection signals (S)). In the depicted embodiment, the OR gate 706-1 may receive the XOR output signal 704-1 and a low value signal. In other embodiments, the OR gate 706-1 may receive an output of a previous OR gate 706 not shown in FIG. 7.

In any case, the OR gate 706-2 may receive the XOR output signal 704-2 and a selection signal (S1) 708-1 from the OR gate 706-1. The OR gate 706-3 may receive the XOR output signal 704-3 and a selection signal (S2) 708-2 from the OR gate 706-2. The OR gate 706-4 may receive the XOR output signal 704-4 and a selection signal (S3) 708-3 from the OR gate 706-3.

Moreover, the OR gate 706-5 may receive the XOR output signal 704-5 and a selection signal (S4) 708-4 from the OR gate 706-4. The OR gate 706-6 may receive the XOR output signal 704-6 and a selection signal (S5) 708-5 from the OR gate 706-5. Furthermore, the OR gate 706-7 may receive the XOR output signal 704-7 and a selection signal (S6) 708-6 from the OR gate 706-6.

With the foregoing in mind, each of the OR gates 706-1, 706-2, 706-3, 706-4, 706-5, 706-6, and 706-7 may provide the respective high selection signals (S1-S7) 708-1, 708-2, 708-3, 708-4, 708-5, 708-6, and 708-7, based on a transition between high and low values of the latched signals 320. In the depicted embodiment, the OR gates 706-1, 706-2, and 706-3 may provide low selection signals (S1-S3) 708-1, 708-2, and 708-3. Subsequently, the OR gate 706-4 may provide a high selection signal (S4) 708-4 after receiving the high XOR output signal 704-4 of the XOR gate 702-4. The high selection signal (S4) 708-4 may cause replacing the erroneous latched signal (Q5) 320-6 with the high corrected signal (QA4) 322-5 to provide the corrected signal (QA5) 322-6, as will be appreciated.

As mentioned above, the XOR gate 702-4 may provide the high XOR output signal 704-4 based on the transition between the low latched signal (Q3) 320-4 and the high latched signal (Q4) 320-5. Moreover, the OR gate 706-5 may provide high selection signal (S5) 708-5 based on receiving the high selection signal (S4) 708-4 and/or the high XOR output signal 704-5. Furthermore, the OR gate 706-6 may provide high selection signal (S6) 708-6 based on receiving the high selection signal (S5) 708-5, and the OR gate 706-7 may provide high selection signal (S7) 708-7 based on receiving the high selection signal (S6) 708-6.

In FIG. 7, the code protection circuit 210 may also include multiplexers (MUXs) 710-1, 710-2, 710-3, 710-4, 710-5, 710-6, 710-7, 710-8, and 710-9. MUXs 710-1 and 710-2 are not shown for simplicity. Each of the MUXs 710-3, 710-4, 710-5, 710-6, 710-7, 710-8, and 710-9 may receive a respective latched signal 320 and a respective corrected signal 322 received from an adjacent MUX. Each of the MUXs 710-3, 710-4, 710-5, 710-6, 710-7, 710-8, and 710-9 may also receive a respective selection signal (S1-S7) 708-1, 708-2, 708-3, 708-4, 708-5, 708-6, and 708-7.

Each of the MUXs 710-3, 710-4, 710-5, 710-6, 710-7, 710-8, and 710-9 may receive two respective input signals. The MUXs 710-3, 710-4, 710-5, 710-6, 710-7, 710-8, and 710-9 may also receive a respective input selection signal (S). Moreover, each of the MUXs 710-1, 710-2, 710-3, 710-4, 710-5, 710-6, 710-7, 710-8, and 710-9 may provide one of the input signals based on the selection signal (S). For example, each of the MUXs 710-3, 710-4, 710-5, 710-6, 710-7, 710-8, and 710-9 may provide a first input signal as the output signal when receiving a low selection signal and may provide a second input signal as the output signal when receiving a high selection signal.

In the depicted embodiment, the MUX 710-3 may receive the latched signal (Q2) 320-3 and the corrected signal (QA1) 322-1. For example, the MUX 710-3 may receive the corrected signal (QA1) 322-1 from the adjacent MUX 710-2 (not shown in FIG. 7). The MUX 710-3 may also receive the low selection signal (S1) 708-1.

The MUX 710-3 may provide the latched signal (Q2) 320-3 as the corrected signal (QA2) 322-3 based on receiving the low selection signal (S1) 708-1. The MUX 710-3 may provide the corrected signal (QA2) 322-3 to the adjacent MUX 710-4 and the counter 212 of the time to digital circuit 200.

The MUX 710-4 may receive the latched signal (Q3) 320-4 and the corrected signal (QA2) 322-3 from the MUX 710-3. The MUX 710-4 may also receive the low selection signal (S2) 708-2. The MUX 710-4 may provide the latched signal (Q3) 320-4 as the corrected signal (QA3) 322-4 based on receiving the low selection signal (S2) 708-2. The MUX 710-4 may provide the corrected signal (QA3) 322-4 to the MUX 710-5 and the counter 212 of the time to digital circuit 200.

Moreover, the MUX 710-5 may receive the latched signal (Q4) 320-5 and the corrected signal (QA3) 322-4 from the MUX 710-4. The MUX 710-5 may also receive the low selection signal (S3) 708-3. The MUX 710-5 may provide the latched signal (Q4) 320-5 as the corrected signal (QA4) 322-5 based on receiving the low selection signal (S3) 708-3. The MUX 710-5 may provide the corrected signal (QA4) 322-5 to the MUX 710-6 and the counter 212 of the time to digital circuit 200.

The MUX 710-6 may receive the latched signal (Q5) 320-6 and the corrected signal (QA4) 322-5 from the MUX 710-5. The MUX 710-6 may also receive the high selection signal (S4) 708-4. The MUX 710-6 may provide the corrected signal (QA4) 322-5 as the corrected signal (QA5) 322-6 based on receiving the high selection signal (S4) 708-4. Accordingly, the MUX 710-6 provided a high output signal instead of the erroneous latched signal (Q5) 320-6. The MUX 710-6 may provide the corrected signal (QA5) 322-6 to the MUX 710-7 and the counter 212 of the time to digital circuit 200.

As mentioned above, and shown in the Table 2 above, parallel signals provided using the Thermometer Code may only include one transition between high and low values of multiple consecutive signals. Moreover, as discussed above, the XOR gate 702-4 may cause providing the high selection signal (S4) 708-4 based on the first transition between the low latched signal (Q3) 320-4 and the high latched signal (Q4) 320-5.

Accordingly, the MUXs 710-7, 710-8, and 710-9 may also provide the corrected signals (QA5-7) 322-6, 322-7, and 322-8 respectively. The MUXs 710-7, 710-8, and 710-9 may also provide the corrected signals (QA5-7) 322-6, 322-7, and 322-8, received from the respective adjacent MUXs 710-6, 710-7, and 710-8, based on receiving high selection signals (S5-7) 708-5, 708-6, and 708-7. As discussed above, each of the OR gates 706-4, 706-5, 706-6, and 706-7 may provide the high selection signals (S5-7) 708-5, 708-6, and 708-7 based at least in part on receiving the high selection signals (S4-6) 708-4, 708-5, and 708-6 provided by the previous OR gates 706-4, 706-5, and 706-6 and/or the high XOR output signals 704-4, 704-5, and 704-6 respectively.

As such, in the depicted embodiment, the MUX 710-7 may provide the high corrected signal (QA5) 322-6, instead of the latched signal (Q6) 320-7, to the MUX 710-8 and the counter 212 of the time to digital circuit 200. Accordingly, the code protection circuit 210 may include circuitry according to the schematic 700 to provide the corrected signals 322. That said, in alternative or additional embodiments, the code protection circuit 210 may also use a different schematic to provide the corrected signals 322.

With these technical effects in mind, using the Thermometer Code with the time to digital circuits may improve consistency of the time to digital circuit. For example, using the Thermometer Code with the time to digital circuits may reduce a time of debugging the time to digital circuit, testing the time to digital circuit, and/or reducing a number of redundancy time measurements. Moreover, a time to digital circuit, including the described converter and the code protection circuit may provide reliable time measurements based on reducing a probability of errors. As described above, such time to digital circuits may correct erroneous signals to mitigate an effect of metastable conditions and/or violations of a signal value setup time in different parts of a circuit.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device comprising:
a ring oscillator configured to provide alternating signals using an alternating code when the ring oscillator is receiving an indication of an event, wherein the alternating signals indicate a time duration of the event;
a converter configured to:
receive the alternating signals provided using the alternating code; and
convert the alternating signals to consistent signals based on a Thermometer Code, wherein the consistent signals indicate the time duration of the event; and
an encoder configured to:
receive the consistent signals; and
provide a time duration of the event based on decoding the consistent signals provided using the Thermometer Code.

2. The electronic device of claim 1, wherein the ring oscillator is configured to provide the alternating signals in parallel at each clock cycle of a clock signal of the electronic device.

3. The electronic device of claim 1, wherein the alternating signals are indicative of an incremental count of the time duration of the event.

4. The electronic device of claim 1, wherein the ring oscillator is configured to receive a trigger signal indicative of the event, and wherein the ring oscillator is configured to provide an indication of a start of the event based on receiving the trigger signal.

5. The electronic device of claim 4, wherein the ring oscillator is configured to provide an indication of an end of the event based on receiving a stop trigger signal subsequent to receiving the trigger signal.

6. The electronic device of claim 1, wherein the consistent signals comprise a number of high signals followed by a number of low signals, a number of low signals followed by a number of high signals, only high signals, or only low signals.

7. The electronic device of claim 1, wherein the converter comprises half splitter circuits to convert the alternating signals to the consistent signals, wherein each of the half splitters comprise a number of inverting circuits, delay circuits, or both.

8. The electronic device of claim 1, wherein the encoder comprises a code protection circuit, wherein the code protection is configured to correct the consistent signals with erroneous values provided using the Thermometer Code.

9. The electronic device of claim 8, wherein the code protection circuit comprises a comparison circuitry configured to correct the consistent signals with erroneous values provided using the Thermometer Code based on comparing consecutive signal values of the consistent signals.

10. A time to digital circuit comprising:
a ring oscillator configured to provide alternating signals using an alternating code indicative of an incremental count of a duration of an event, wherein consecutive signals of the alternating signals comprise one or more transitions between high and low values;
a converter configured to receive the alternating signals, wherein the converter is configured to convert the alternating signals to consistent signals based on a Thermometer Code, wherein consecutive signals of the consistent signals comprise only one transition between high and low values;
a code protection circuit configured to receive the consistent signals, wherein the code protection circuit is configured to correct inconsistent signals of the consistent signals based on determining more than one transition between high and low values of the consecutive signals of the consistent signals; and
a counter configured to receive the corrected consistent signals and determine a time duration of the event based on receiving the corrected consistent signals.

11. The time to digital circuit of claim 10, wherein the ring oscillator is configured to receive a trigger signal for the duration of the event, wherein the ring oscillator is configured to provide the alternating signals when receiving the trigger signal.

12. The time to digital circuit of claim 10, wherein the ring oscillator is configured to provide the alternating signals in parallel in a clock cycle of a clock signal associated with the time to digital circuit.

13. The time to digital circuit of claim 10, wherein the converter comprises half splitters to convert the alternating signals to the consistent signals.

14. The time to digital circuit of claim 13, wherein the half splitters comprise inverting circuits to convert the alternating signals to the consistent signals.

15. The time to digital circuit of claim 10, wherein the converter is configured to provide the consistent signals in parallel in a clock cycle of a clock signal associated with the time to digital circuit.

16. The time to digital circuit of claim 10, wherein the code protection circuit is configured to compare the consecutive signals of the consistent signals to determine more than one transition between the high and low values of the consecutive signals of the consistent signals.

17. The time to digital circuit of claim 16, wherein the code protection circuit comprises comparison circuitry to compare the consecutive signals of the consistent signals.

18. The time to digital circuit of claim 10, wherein the time to digital circuit comprises a latching circuit configured to receive the consistent signals from the converter and provide the received consistent signals to the code protection circuit.

19. A method comprising:
receiving, by a time to digital circuit, an indication of a start of a duration of a time to be measured;
providing, by the time to digital circuit, consistent signals provided based on a Thermometer Code indicative of an incremental count of the duration of the time;
correcting, by the time to digital circuit, erroneous signal values of the consistent signals provided based on the Thermometer Code;
counting, by the time to digital circuit, the duration of the time based on the incremental count of the corrected consistent signals.

20. The method of claim 19, comprising:
providing, by the time to digital circuit, alternating signals provided based on an alternating code in response to receiving the indication of the start of the duration of the time;
providing, by the time to digital circuit, the consistent signals by converting the alternating signals to the consistent signals, wherein consecutive consistent signals provided based on the Thermometer Code comprise only one transition between high and low signal values; and
correcting, by the time to digital circuit, erroneous signal values of the consistent signals is based on determining that more than one transition between high and low signal values of the consecutive consistent signals that are provided based on the Thermometer Code.

* * * * *